United States Patent
Shoji et al.

(10) Patent No.: US 7,400,153 B2
(45) Date of Patent: Jul. 15, 2008

(54) DETECTOR WITH CAPACITANCE SENSOR FOR DETECTING OBJECT BEING CAUGHT BY DOOR

(75) Inventors: Shinichi Shoji, Nagoya (JP); Akihiro Okushima, Nishi-Kamo-Gun (JP); Hiroyuki Sueyasu, Kasugai (JP); Keiichi Nagayama, Aichi-gun (JP); Yukinori Kurumado, Nagoya (JP)

(73) Assignees: OMRON Corporation, Kyoto (JP); Honda Motor Co., Ltd., Tokyo (JP); Mitsuba Corporation, Gunma (JP)

( * ) Notice: Subject to any disclaimer, the term of this patent is extended or adjusted under 35 U.S.C. 154(b) by 0 days.

(21) Appl. No.: 11/408,513

(22) Filed: Apr. 20, 2006

(65) Prior Publication Data

US 2006/0186900 A1    Aug. 24, 2006

Related U.S. Application Data

(62) Division of application No. 10/758,550, filed on Jan. 14, 2004, now abandoned.

(30) Foreign Application Priority Data

Jan. 16, 2003    (JP) .............................. 2003-008292

(51) Int. Cl.
*G01R 27/26* (2006.01)
*G01P 15/125* (2006.01)
*G01N 27/22* (2006.01)

(52) U.S. Cl. ........................ 324/686; 324/661; 324/688; 73/514.32; 73/335.04; 73/780; 307/10.1; 307/9.1

(58) Field of Classification Search ................. 324/522, 324/658, 548, 661, 686; 73/514.32, 335.04, 73/774, 780; 307/10.1, 9.1
See application file for complete search history.

(56) References Cited

U.S. PATENT DOCUMENTS

| 4,875,533 | A | * | 10/1989 | Mihara et al. ................ 177/144 |
| 5,082,588 | A |   | 1/1992  | Elliott |
| 5,992,240 | A |   | 11/1999 | Tsuruoka et al. |
| 6,437,772 | B1 |  | 8/2002  | Zimmerman et al. |

(Continued)

FOREIGN PATENT DOCUMENTS

JP    2000-160897    6/2000

(Continued)

*Primary Examiner*—Andrew H Hirshfeld
*Assistant Examiner*—John Zhu
(74) *Attorney, Agent, or Firm*—Weaver Austin Villeneuve & Sampson LLP

(57) ABSTRACT

A detector for detecting an object that may be feared to or about to be caught by a closing door such as a slide door of a vehicle incorporates a capacitance sensor with a directionality characteristic in the direction of its detection surface. The detector has a main body enclosing detection electrodes, an insulating material placed in between and a shield electrode serving to provide the directionality. A protective cover may cover the shield electrode and the detection electrodes. A water-repellant finish may be provided at least on a portion of the outer surface of the main body including the detection surface for preventing water drops from remaining or becoming larger. A plurality of mutually adjacent protrusions may be formed on the protective cover with thickness decreasing in the direction of protrusion for making it difficult for water drops to remain.

7 Claims, 2 Drawing Sheets

U.S. PATENT DOCUMENTS

| | | | |
|---|---|---|---|
| 6,456,198 B1 * | 9/2002 | Kato et al. | 340/564 |
| 6,503,831 B2 | 1/2003 | Speakman | |
| 6,696,948 B2 | 2/2004 | Thompson et al. | |
| 6,700,393 B2 * | 3/2004 | Haag et al. | 324/674 |
| 6,768,413 B1 * | 7/2004 | Kemmann et al. | 340/5.72 |
| 6,819,316 B2 * | 11/2004 | Schulz et al. | 345/174 |
| 6,825,752 B2 * | 11/2004 | Nahata et al. | 340/5.64 |
| 6,847,289 B2 * | 1/2005 | Pang et al. | 340/426.28 |
| 6,972,575 B2 * | 12/2005 | Lambert et al. | 324/658 |

FOREIGN PATENT DOCUMENTS

| | | |
|---|---|---|
| JP | 2001-032627 | 2/2001 |
| JP | 2003-202383 | 7/2003 |
| WO | WO 94/24788 | 10/1994 |

* cited by examiner

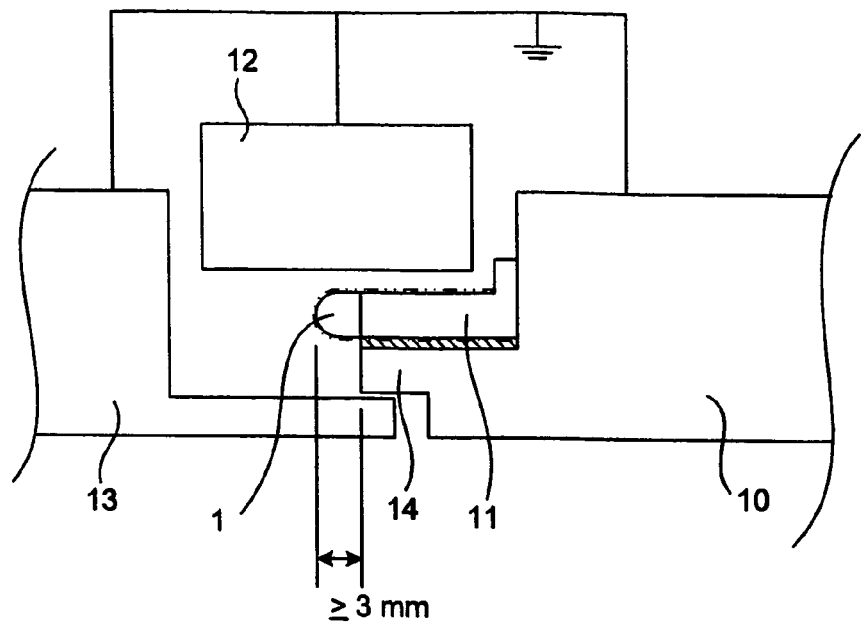
FIG. 1
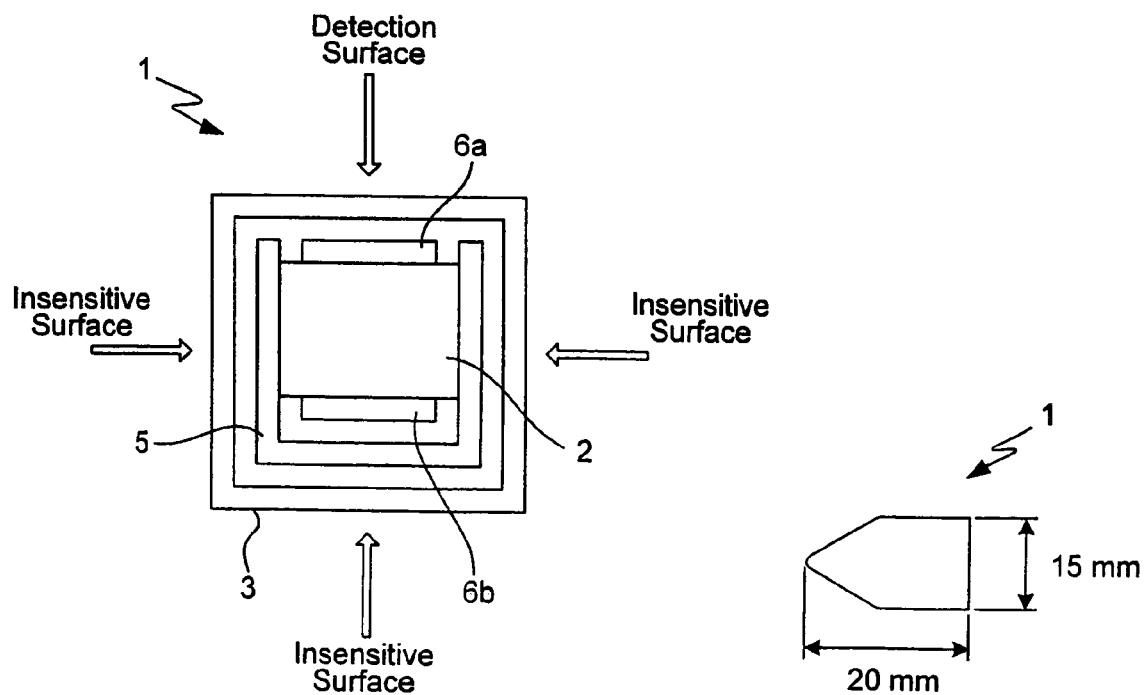
FIG. 2A
FIG. 2B though vertical text
DETECTOR WITH CAPACITANCE SENSOR FOR DETECTING OBJECT BEING CAUGHT BY DOOR This is a divisional of application Ser. No. 10/758,550 filed Jan. 14, 2004, now abandoned.

BACKGROUND OF THE INVENTION

This invention relates to a detector with a capacitance sensor (or capacitive sensor) for detecting an object that may be caught or is likely to be caught by a closing slide door, say, of a vehicle.

Controller systems for a structure adapted to open and close such as an electrically powered slide door of a vehicle are provided with a safety feature for preventing an object such as a person's body from becoming caught thereby. In the case of an automatically closing mechanism adapted to automatically bring the structure (hereinafter referred to as the door) to the fully closed position even after the user stops its operation, this may be done by detecting an object that is caught or likely to be caught and at least stopping the operation of the automatically closing mechanism. The motion of the door may also be reversed.

Prior art detectors used for such a purpose were either for direct detection or for indirect detection. Indirect detection may be made on the basis of operation data of the driver motor such as its angular position and its rotary speed or the driving power. Direct detection may be made by means of a sensor for detecting a human body approaching or coming into contact with an open end portion of the door. Indirect detection has problems in that it is relatively difficult to quickly and reliably detect a caught object at a load as low as possible. Direct detection is superior from the point of view of reliability because an object of detection is directly detected but since a pressure-sensitive switch has been used as a sensor of this type, detection could not be made quickly at a low load. This was because a pressure-sensitive switch comprised a cable, say, of a conductive resin material adapted to function when deformed by a pressure from the target object such that an internal conductive member comes into a contacting position. In other words, the switch can function only after the target object comes into contact with a pressure of a certain magnitude and the function of preventing the object from being caught begins to work only at such point in time.

A sensor for generally detecting an approaching target object without contacting it may be of an optical type, an electromagnetic wave type or a capacitance type. Sensors of the optical type have the problem that the detection area cannot be defined along a curved end portion of a structure such as a door, that is, there result so-called insensitive zones. With a sensor of the electromagnetic type, it is difficult to limit the directionality to the direction of approach to the open end portion of the door and there is a high probability of an erroneous detection. Capacitance-type sensors seem to be superior because they can be easily attached to a curved end part, there is no insensitive part and the directionality can be easily controlled. The present inventors have been examining how to use a capacitance sensor as a detector for an object caught or being caught by a powered slide door, say, of a vehicle.

No prior art example is known to have shown the use of a capacitance sensor for detecting an object caught by a powered slide door of a vehicle. Japanese Patent Publication Tokkai 10-96368 has disclosed a detector using a capacitance sensor for a door of a railroad passenger car. Japanese Patent Publication Tokkai 2001-264448 has disclosed the use of a capacitance sensor for detecting a person caught by a shutter. Japanese Patent Publication Tokkai 2001-318162 has disclosed a pin ball machine sensor with a high sensitivity for detecting a passing pin ball by providing a plurality of pairs of capacitance-providing electrodes and on the basis of differentials of signals corresponding to each capacitance.

According to the studies by the present inventors, however, capacitance sensors as described above cannot be used for a structure such as a door because of the problems of the kinds to be described below if there are water drops such as rain drops.

(A) When the door is at a positive potential, the sensor is likely to function incorrectly, becoming switched on if a body part such as a hand of a person merely approaches the outer side surface of the door while water drops such as rain drops are attached to it.

(B) If water drops become attached to the detection surface of a capacitance sensor over its entire width, the sensor is likely to function incorrectly, becoming switched on because of these water drops. In the case of a sensor with a sectionally U-shaped shield electrode with an opening on the side of the detection surface in order to provide directionality as much as possible only on the side of the detection surface, for example, a detection signal is likely to be incorrectly switched on if water drops become attached so as to span between both its end positions.

(C) If water drops become attached continuously from the door to a portion of the detection surface, an error is likely to result although water drops may not be attached all over the detecting surface.

It is therefore an object of this invention to provide a capacitance sensor which is not likely to function incorrectly even in an environment where water drops such as rain drops fly around, as well as a reliable detector using such a sensor for detecting an object being caught by a door.

SUMMARY OF THE INVENTION

A detector according to this invention may be characterized simply as having a capacitance sensor with an outer surface with a water-repellant finish at least over the detection surface of its main body with a protective cover, or somewhat more in detail as having specified directionality and comprising detection electrodes, an insulating material insulating the detection electrodes from each other, a main body containing the detection electrodes and the insulating material and having a detection surface (to be defined below), and a water-repellant finish over at least a portion of the main body including the detection surface.

The main body may further include a shield electrode inside, open toward the detection surface and holding the detection electrodes inside, as well as a protective cover covering both the shield electrode and the detection electrodes. A shield electrode thus structured serves to significantly increase the directionality and reduce the possibility of erroneous detection, say, when the object of detection approaches somewhere else away from the specified detection area.

In the above, the "detection surface" is the portion of the sensor surface with increased sensitivity in order to limit the direction in which a target object is to be detected, or its directionality. "Water-repellant finish" means forming a surface with a water-repellant material or covering a surface with a water-repellant material which may be in the form of a membrane or a layer, and this may be formed by a simple process of pasting a silicon tape on a surface. The "outer surface" means the surface of the main body or the portion of the sensor having detection electrodes such as the surface of a protective cover over the main body. If possible, it is desirable to have the water-repellant finish all over the outer surface inclusive of side surfaces which are not the detection surface.

With a capacitance sensor thus structured, water drops do not become attached easily to its outer surface inclusive of the detection surface and, even if they become attached, they are dispersed quickly and flow down easily due to the water-repellant surface property. Since large or continuous water drops which cause erroneous operations are not generated, the possibility of incorrect functioning of the sensor at least of the types (B) and (C) described above is significantly reduced.

A detector according to another embodiment of the invention may be characterized similarly except that its detection surface is formed so as to have unevenness, that is, not being flat but having indentations or protrusions, or both. Such surface shapes make it harder for water drops to remain attached, preventing them in particular to become connected continuously across the entire width of the detection surface. It now goes without saying that the characteristics of the sensors of the first and second embodiments may be combined together to gain some synergistic effects.

Detectors according to this invention are primarily for detecting a target object which may be caught or is likely to be caught by a closing slide door, say, of a vehicle. Such an object may be feared as being about to or likely to be caught by the door because it is approaching the door and is herein simply referred to, for the simplicity of description, as an "object being caught" by a door. Detectors of this invention may be generally characterized as comprising a capacitance sensor of this invention such as described above including a sensor circuit and having its main body provided on an open end part of the door.

In the above, the open end part of the door is that portion of the door which, when closed, comes into contact with the opposite portion of the door frame. With a detector thus formed, the possibility of erroneous detection can be reduced especially since water drops are unlikely to form a continuous body of water on the peripheral portions of the main body.

It is preferable to have the door grounded such that its voltage may be prevented from becoming positive and water drops can be more dependably prevented from remaining attached. The problem (A) described above can be more reliably obviated. The grounding may be accomplished merely by connecting a component of the vehicle kept generally at the ground potential.

It is also preferable to arrange the main body such that its detection surface will be at a position farther protruding from the open end part of the door to which the main body is attached. This further has the effect of more dependably preventing water drops from becoming connected continuously over the entire distance between the door and the detection surface.

BRIEF DESCRIPTION OF THE DRAWINGS

FIG. 1 is a schematic drawing of a detector embodying this invention with a capacitance sensor and portions of a vehicle on which the sensor is set.

FIG. 2A is a schematic drawing of the inner structure of the capacitance sensor of FIG. 1 and FIG. 2B shows the sectional shape and dimensions of its main body.

DETAILED DESCRIPTION OF THE INVENTION

Figure 3A:
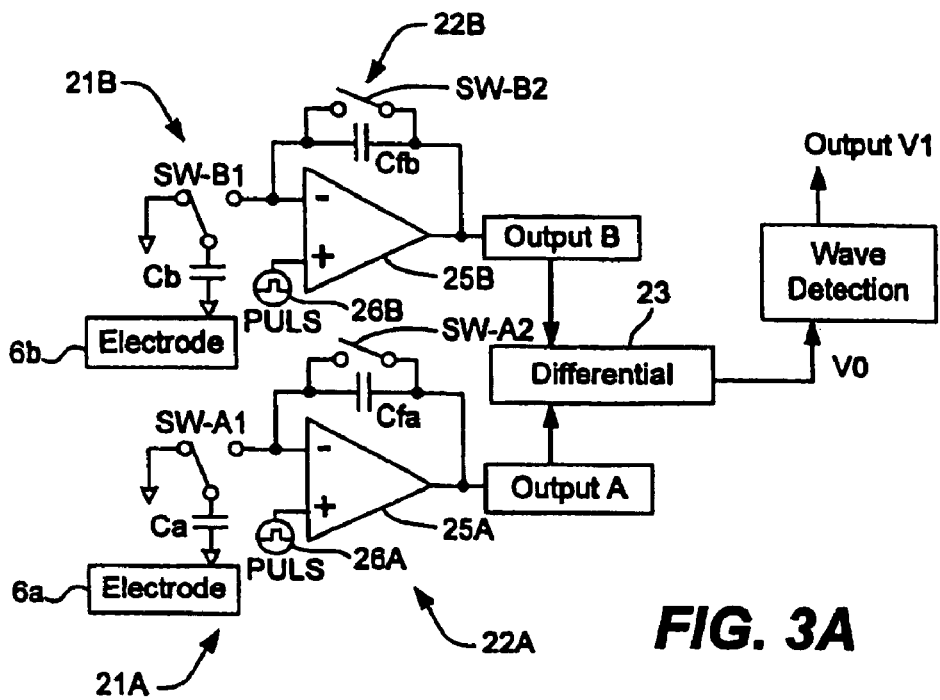
FIG. 3A is a schematic diagram of the sensor circuit and FIG. 3B is a wave diagram for showing its operations.

The invention is described next by way of an example, which is a detector for detecting by means of a capacitance sensor a person (regarded as its object of detection) who has approached a position within a region close enough, say, to a four-wheeled automobile (vehicle) and may be feared to be in danger of becoming caught by its sliding door. FIG. 1 shows a detector embodying the invention with a capacitance sensor, together with portions of the vehicle on which this sensor is set. FIG. 2A shows the structure of the sensor inside its main body 1, and FIG. 2B is its sectional view, showing an example of its sectional shape and dimensions.

In FIG. 2A, the main body 1 is shown with its detection surface (defining the direction of its directionality) facing upward. The other surfaces facing in other directions are therefore considered to be "insensitive surfaces". The main body 1 contains within itself a shield electrode 5 and detection electrodes 6a and 6b. The shield electrode 5 may be made of an aluminum foil, being cross-sectionally U-shaped with the opening in the direction of the detection surface (in the upward direction in FIG. 2A). The detection electrodes 6a and 6b may be made of a copper foil and disposed inside the shield electrode 5. An insulating material 2 with a low dielectric constant such as foamed styrene fills the space between the detection electrodes 6a and 6b inside the shield electrode 5. Another insulating material 3 with a low dielectric constant such as a heat shrinkable tube serves as a protective cover, covering the whole in a protective manner.

The main body 1 thus structured may be made sufficiently compact and flexible and hence can be bent in the longitudinal direction. Thus, as shown in FIG. 1, this main body 1 can be conveniently set on a slide door (a rear door) 10 of a vehicle along its open end portion. The main body 1 is so oriented that the opening part of the shield electrode 5 is in the direction of the position where a person is likely to be caught by the slide door 10 such that the sensor has accordingly a high sensitivity in this direction and is basically insensitive in the other directions.

Although FIG. 2A shows the main body 1 as having an approximately rectangular outer cross-sectional shape but it was merely for the convenience of illustration. In reality, it may be shaped as shown in FIGS. 1 and 2A, protruding in the direction of the detection surface. Such a shape with a protrusion may be obtained by causing the insulating material 3 to protrude only in the direction of the detection surface. The dimensions of the exterior of the main body 1 may be as shown in FIG. 2B with a width of about 15 mm and a thickness of about 20 mm.

FIG. 1 shows the main body 1 attached to the open end part of the slide door 10 by means of a bracket 11. When the door 10 is closed, as shown in FIG. 1, its open end part nearly contacts a front door 13 with a small gap left therebetween, while sandwiching a pillar 12 connected to the main body of the vehicle. A hem part 14 is formed on the open end portion of the slide door 10, protruding toward the front door 13. As the slide door 10 is closed, its hem part 14 extends forward inside the front door 13 and overlaps therewith to close the vehicle door.

The main body 1 is disposed inside the hem part 14 towards the interior of the vehicle and is attached to the front end of the bracket 11, say, by means of a adhesive so as to protrude still farther forward towards the front door 13 than the hem part 14, say, by a distance equal to or greater than 3 mm, as shown in FIG. 1.

As shown symbolically by broken lines in FIG. 1, the external surface of the main body 1 and its neighboring surface portions (including the whole or parts on the side of the main body 1) of the bracket 11 and the hem part 14 are covered with a silicon tape or the like to provide a water-repellant finish.

The slide door 10, the front door 13 and the pillar 12 are all grounded and at ground potential. Since power needs to be supplied to an actuator (not shown) for moving the slide door 10 into a retracted position after it is closed, such a slide door used to remain at a positive potential according to prior art technologies. According to the present invention, a grounding wire (as schematically shown in FIG. 1) is provided for electrically connecting the body of the slide door 13 with a grounding conductor normally disposed below the door such that the slide door 10, too, remains at ground potential.

FIG. 3A shows the structure of a circuit (sensor circuit) connected to the main body 1 for driving the sensor and carrying out signal processing operations. As shown, the sensor circuit is provided with pulse drive circuits 21A and 21B respectively for the detection electrodes 6a and 6b, integrating circuits 22A and 22B, a differential circuit 23 and a wave detection circuit 24.

Pulse drive circuit 21A comprises a switch SW-A1 which is driven by a driver circuit (not shown) to switch the connection to the detection electrode 6a at a fast rate. The switch SW-A1 has a common terminal, a ground terminal and a DPA terminal, the common terminal being connected to the detection electrode 6a, the ground terminal being connected to the grounding conductor of the vehicle, and the DPA terminal being connected to the inversion input terminal of an operational amplifier 25A (to be explained below).

Figure 3B:
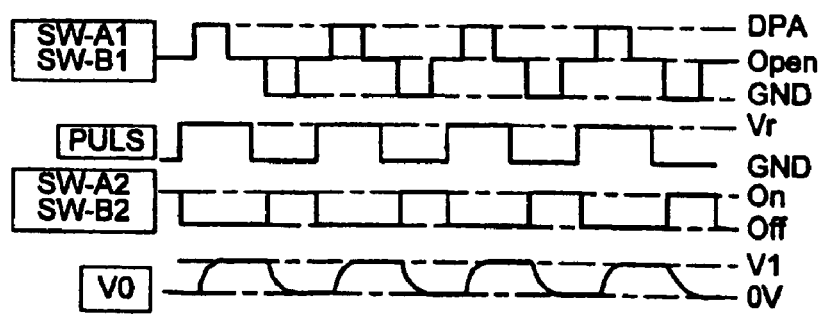

As shown in FIG. 3B, the switch SW-A1 is switched periodically at a fast rate from one to another among the GND condition wherein the common terminal is connected to the ground terminal, the Open condition where the common terminal is not connected to either of them, and the DPA condition wherein the common terminal is connected to the DPA terminal. In FIG. 3A, symbol Ca indicates the capacitance due to a body part such as a hand of a person which is an object of detection and the detection electrode 6a.

Pulse drive circuit 21B comprises a switch SW-B1 which is similar to the switch SW-A1 and of which the common terminal is connected to the detection electrode 6b, the ground terminal is connected to the grounding terminal of the vehicle and the DPA terminal is connected to the inversion input terminal of another operational amplifier 25B (to be explained below). The switch SW-B1 also operates as shown in FIG. 3B. In FIG. 3A, symbol Cb indicates the capacitance between the body part and the detection electrode 6b.

Integrating circuit 22A is provided with the operational amplifier 25a, a switch SW-A2 forming a return circuit of the operational amplifier 25a, a capacitor Cfa and a power source circuit 26A for supplying a pulse voltage to the non-inversion input terminal of the operational amplifier 25A.

In the above, the capacitor Cfa is connected between the output terminal (OUTPUT A) and the inversion input terminal of the operational amplifier 25A. The switch SW-A2 is connected in parallel with the capacitor Cfa and serves to open and close the connection between the two terminals of the capacitor Cfa (that is, between the output and inversion input terminals of the operational amplifier 25A). The switch SW-A2 is driven by a driver circuit (not shown) and is switched from an ON-condition to an OFF-condition, as shown in FIG. 3B, while the switch SW-A1 is in Open condition before being switched to the DPA condition. The output (PULS) from the power source circuit 26A changes periodically as shown in FIG. 3B, switching from the GND level to the charging voltage Vr as the switch SW-A2 changes from the ON-condition to the OFF-condition and switching from the charging voltage Vr to the GND level after the switch SW-A1 changes from the DPA condition to the Open condition.

Integrating circuit 22B is similar to integrating circuit 22A, being provided with the operational amplifier 25b, a switch SW-B2 forming a return circuit of the operational amplifier 25b, a capacitor Cfb and a power source circuit 26B for supplying a pulse voltage to the non-inversion input terminal of the operational amplifier 25B.

In the above, the capacitor Cfb is connected between the output terminal (OUTPUT B) and the inversion input terminal of the operational amplifier 25B. The switch SW-B2 is connected in parallel with the capacitor Cfb and serves to open and close the connection between the two terminals of the capacitor Cfb (that is, between the output and inversion input terminals of the operational amplifier 25B. The switch SW-B2 operates like the switch SW-A2, as shown in FIG. 3B. The output from the power source circuit 26B changes like that from the power source circuit 26A, as shown in FIG. 3B.

The differential circuit 23 is for calculating and outputting the difference between the outputs (OUTPUT A and OUTPUT B) from the operational amplifiers 25A and 25B. The wave detection circuit 24 is for outputting a signal voltage V1 on the basis of the output VO from the differential circuit 23. If the output VO from the differential circuit 23 changes as shown in FIG. 3B, the high-voltage portion of this waveform, or the output voltage VO when it has stabilized after the switches SW-A2 and SW-B2 are switched off, is outputted as the signal voltage V1.

If a dielectric body such as a person's hand approaches the detection surface of a capacitance sensor thus structured, the signal voltage V1 changes in a sensitive manner. Thus, a highly sensitive detection is possible by comparing this signal voltage with a specified threshold value. Since this sensor is of a differential type, making use of a differential between signals based on two detection electrodes, furthermore, it is not likely to be affected by factors such as noise and it is basically possible to carry out a highly reliable detection. It is to be noted that this capacitance sensor is not only of a differential type but also of a charge transfer type, transferring electric charges between capacitors Cfa and Cfb and capacitors Ca and Cb.

If a capacitance sensor as described above is used in a detector for detecting an object caught (and/or likely to be caught) by a door, the following advantages can be obtained.

(1) A detection area may be defined along a curved open end part of a door of a vehicle to eliminate the insensitive zones, and since the directionality of the detector can be limited to the direction of approach to the open end part, the possibility of an erroneous operation is small.

(2) Since a dielectric object such as a person's hand can be detected in a non-contacting manner, an object which has been caught or is likely to become caught can be detected at an early stage and a preventive measure such as stopping the closing motion of the door or opening the door by a specified distance) can be carried out by hardly generating any load due to the impact.

(3) Since a capacitance sensor of a differential charge-transfer type is used, a highly sensitive detection against noise is possible.

(4) Water-repellant finish is provided not only on the main body but also on surfaces around it. Water drops are not likely to remain attached to such surfaces and if they become attached, they become dispersed by the repelling force and are likely to flow down without forming large or continuous drops that would tend to cause erroneous operations due at least to problems of the types (B) and (C).

(5) Since the detecting surface of the main body is made uneven and not flat, it is difficult for water drops to remain attached. The possibility of water drops becoming attached so as to form a continuous band across the detecting surface is reliably reduced.

(6) Since the slide door is grounded, the voltage of the door is reliably prevented from becoming positive and errors due to problems of the type (A) are prevented.

(7) Since the detection surface of the main body is at a position farther protruding forward than the tip of the hem part of the door, the possibility of rain drops becoming connected all the way across from the door to the detection surface is extremely small. For this reason, too, errors due to problems of the types (B) and (C) are unlikely.

Figure 4A:
FIGS. 4A, 4B and 4C are other sectional shapes of the main body according to this invention.
Figure 4B:
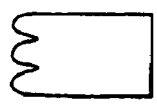
Figure 4C:
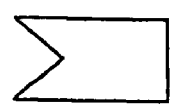

The example described above is not intended to limit the scope of the invention. Many modifications and variations are possible within the scope of the invention. For example, the detection surface of the main body 1 with the cover need not be a simple protrusion but may be of any other uneven shape having a plurality of externally directed mutually adjacent protrusions with thickness decreasing in the direction of protrusion as shown in FIGS. 4A, 4B and 4C. In summary, the invention provides sensors unlikely to make errors even in an environment with water drops such as rain drops splashing around and reliable detectors using such a sensor for detecting an object caught or likely to be caught by a door.

What is claimed is:

1. A detector for detecting an object being caught by a door, said detector comprising:
   detection electrodes;
   an insulating material insulating said detection electrodes from each other;
   a main body provided on an open end part of said door, said main body containing said detection electrodes and said insulating material;
   a sensor circuit which, together with said main body, forms a capacitance sensor having specified directionality;
   means for grounding said door;
   a shield electrode inside said main body, said shield electrode being open toward said detection surface, said detection electrodes being disposed inside said shield electrode; and a protective cover covering said shield electrode and said detection electrodes;
   wherein said main body includes a detection surface defined by said directionality and said detector further comprises means for grounding said door; and
   wherein said detection surface with said protective cover has a plurality of mutually adjacent protrusions with thickness decreasing in the direction of protrusion.

2. The detector of claim 1 wherein a water-repellant finish is provided over at least a portion of said protective cover and over said detection surface.

3. A detector for detecting an object being caught by a door, said detector comprising:
   detection electrodes;
   an insulating material insulating said detection electrodes from each other;
   a main body provided on an open end part of said door, said main body containing said detection electrodes and said insulating material;
   a sensor circuit which, together with said main body, forms a capacitance sensor having specified directionality;
   a shield electrode inside said main body, said shield electrode being open toward said detection surface, said detection electrodes being disposed inside said shield electrode; and a protective cover covering said shield electrode and said detection electrodes;
   wherein said main body includes a detection surface defined by said directionality, said detection surface being at a position farther protruding from the open end part of said door;
   wherein portions of said door adjacent to said main body and external surface of said main body are provided with a water-repellant finish; and
   wherein said detection surface with said protective cover has a plurality of mutually adjacent protrusions with thickness decreasing in the direction of protrusion.

4. The detector of claim 3 wherein a water-repellant finish is provided over at least a portion of said protective cover and over said detection surface.

5. The detector of claim 3 wherein said water-repellant finish comprises a silicon tape.

6. The detector of claim 3 wherein a hem part is formed on said open end part of said door for closing said open end part by overlapping with said door, and said main body is disposed on inner side of said hem part towards said door.

7. The detector of claim 6 wherein said hem part is also provided with said water-repellant finish.

\* \* \* \* \*